(12) United States Patent
Fukuda et al.

(10) Patent No.: US 6,228,651 B1
(45) Date of Patent: *May 8, 2001

(54) PREPARATION OF ANALYTICAL SAMPLES, ANALYSIS OF IMPURITIES, PREPARATION OF HIGHLY PURIFIED PHOSPHORIC ACID AND PRODUCTION OF SEMICONDUCTOR DEVICES

(75) Inventors: Hiroyuki Fukuda, Kawasaki; Takashi Nakanishi, Kanazawa; Mitsuru Hirose, Takaoka, all of (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/223,279

(22) Filed: Dec. 30, 1998

Related U.S. Application Data

(62) Division of application No. 08/637,432, filed on Apr. 25, 1996, now Pat. No. 5,910,257.

(30) Foreign Application Priority Data

Apr. 27, 1995 (JP) .................................................. 7-104291
Mar. 21, 1996 (JP) .................................................. 8-64635

(51) Int. Cl.$^7$ .................................................. G01N 33/20

(52) U.S. Cl. ............................ 436/57; 436/73; 436/77; 436/100; 436/174; 436/177; 436/178; 436/182

(58) Field of Search .................................. 436/57–59, 73, 436/77, 100, 103, 174, 177, 178, 182; 216/93; 210/682

(56) References Cited

U.S. PATENT DOCUMENTS 5,501,767 * 3/1996 Sorensen et al. .................. 156/662.1

OTHER PUBLICATIONS

J. O'M. Bockris et al. Chem. Abstr. 1969, 71, 74410w., Oct. 1969.*
V. Z. Krasil'shchik et al. Tr., Vses. Naucho–Issled. Inst. Reakt. Osobo Chist. Khim. Veshthestv 1973, 35, 171–179.*
L. N. Filatova et al. Zh. Prikl. Khim. 1974, 47, 2106–2108, Sep. 1974.*
C.–Y. Yang et al. Analyst, 1982, 107, 1492≅1495, Dec. 1982.*
C. Bejan et al. Rev. Chim. 1990, 41, 713–718, Sep. 1990.*
W. J. McCabe et al. J. Radioanal. Nucl. Chem. 1992, 159, 267–279.*
B. Fourest et al. J. Alloys Compd. 1994, 213/214, 219–225.*
M. Garcia–Leon et al. J. Radioanal. Nucl. Chem. 1995, 197, 173–184.*

(List continued on next page.)

*Primary Examiner*—Arlen Soderquist
(74) *Attorney, Agent, or Firm*—Armstrong, Westerman, Hattori, McLeland & Naughton, LLP

(57) ABSTRACT

A process for the preparation of an analytical sample characterized by depositing and separating solely the impurity to be analyzed from phosphoric acid; a process for analysis of the impurity characterized by depositing and separating solely the impurity from phosphoric acid and applying the separated material to analysis; a process for preparation of high grade phosphoric acid characterized by depositing and separating solely the impurity from phosphoric acid to be purified; a process for the fabrication of a semiconductor device characterized by using phosphoric acid, the impurity content of which is not more than $10^{-3}$ Bq/mL, defined by the concentration of a contained radioactive element selected from the group consisting of Pb, Bi and Po, as a processing solution.

8 Claims, 3 Drawing Sheets

OTHER PUBLICATIONS

Building–in Reliability: Soft Errors–A Case Study, Zille Hasnain and Akram Ditali, pp. 276–281; Publication IEEE/RPS 1992 (30TH International Reliability Physics Symposium).

*Monitoring Alpha Particle Sources During Wafer Processing*, Akram Ditali and Zille Hasnain, pp. 136–138; Semiconductor International—Jun. 1993.

Procedure for the Determination of $^{210}$Pb in Phosphate Ore, Gypsum and Phosphoric Acid by Radio chemical Separation and Gamma–ray Spectrometry, Andre Lagerwaard and Joost R.W. Woittiez, pp. 1421–1425; Analyst—Jun. 1994, vol. 119.

* cited by examiner (A)

(B)

(C)

(D)

PREPARATION OF ANALYTICAL SAMPLES, ANALYSIS OF IMPURITIES, PREPARATION OF HIGHLY PURIFIED PHOSPHORIC ACID AND PRODUCTION OF SEMICONDUCTOR DEVICES

This application is a division of prior application Ser. No. 08/637,432 filed Apr. 25, 1996 now U.S. Pat. No. 5,910,257.

BACKGROUND OF THE INVENTION

1. Field of the Invention

The present invention relates to phosphoric acid and its use, and more particularly the present invention relates to a process for the preparation of an analytical sample for use in quantitative analysis of a radioactive impurity in phosphoric acid; an analytical process for quantitatively analyzing a radioactive impurity in phosphoric acid; a process for the preparation of highly purified phosphoric acid substantially containing no radioactive impurity; and a process, for the production of semiconductor devices, in which highly purified phosphoric acid is used as a processing solution. Particularly, the present invention can be advantageously applied to a fabrication process, for semiconductor devices, in which phosphoric acid is used as a processing solution.

2. Description of the Related Art

It is well known that phosphoric acid is frequently used as an etching agent in the process of fabrication of semiconductor devices. For example, wet etching, in which phosphoric acid is used as a processing solution, is applied to selectively remove an insulating layer or film, e.g., a thin film of silicon nitride formed on a semiconductor substrate. However, phosphoric acid usually contains a radioactive nuclear species, e.g., $^{210}Po$ (half-life period=138.4 days), as an impurity, which is apt to be either adsorbed on a silicon substrate in the phosphoric acid processing, or deposited thereon as a function of non-electrolytic plating. After finishing a series of steps for fabrication of a semiconductor device, $^{210}Po$, which was previously adsorbed on the silicon substrate, may emit α-ray, which leads to soft errors (memory errors) in a electronic device, e.g., a semiconductor memory, etc. The reason, why $^{210}Po$ is contained in phosphoric acid, mainly resides in the composition of phosphorous ore which was used as the starting material for preparation of phosphoric acid. As described in K. Kubo, "Industrial Inorganic Chemistry", p.p. 121 to 129, published by Asakura Publishing Co. (October 5, 1962), phosphoric acid is produced either by the wet process, in which phosphoric acid is obtained by acidic decomposition of phosphoric ore with sulfuric acid, or by the dry process, in which phosphoric ore is reduced to phosphorus, which is, then, oxidized to phosphorous pentaoxide, which is finally, dissolved in water to obtain phosphoric acid. However, radioactive impurities contained in the raw phosphoric ore may still remain in the resulting phosphoric acid without being removed.

The soft errors of an electronic device are not only generated by $^{210}Po$ set forth above, but also by the other radioactive impurities contained in phosphoric acid, according to the inventors' knowledge. The impurities which are expected to cause soft errors, are, for example, Bi (214, 210, 215, 212), Pb (214, 210, 211, 212), Ac (227, 228) and Th (234, 230, 231, 227, 232, 228). Particularly, the problems of Pb, Bi and Po are important. Therefore, the invention is expected to eliminate the undesirable influence caused by such radioactive impurities.

The mechanism of generation of soft errors will be more clearly understood after referring to the background technologies described hereinafter.

Japanese Unexamined Patent Publication (Kokai) No. 3-207596 points out that the existence of a very small amount of the radioactive elements $^{210}Pb$ and $^{210}Po$ contained in lead alloy solder material, is a cause of generating errors in the memory of semiconductor devices, e.g., ICs, LSIs etc., and teaches reduction of the content of such radioactive elements to less than 5 ppb to decrease the counted number of radioactive α-particles. In addition, it teaches, in the lower column on page 2, that $^{210}Pb$ and $^{210}Po$ emit β-ray and α-ray as a result of the following radioactive disintegration:

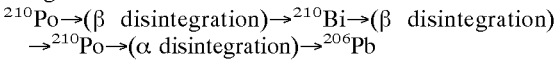

Particularly, it is disclosed that α-disintegration, which is generated in the course of transformation of $^{210}Po$ to $^{206}Pb$, is a cause of errors in memory.

Japanese Examined Patent Publication (Kokoku) No. 60-15152 teaches that a resin-sealed highly integrated semiconductor memory device, which does not suffer from soft errors due to α-ray, can be fabricated by providing an at least 40 μm thick α-ray shielding layer which contains a resinous material contaminated with not more than 0.2 ppb of the total content of uranium and thorium, on the memory element. As described in "Kagaku Dai-jiten (Great Chemical Dictionary)", Vol. 8, pp. 811 to 812, published by Kyoritsu Publisher (Feb. 28, 1937), $^{210}Po$ is a radioactive element having a half value period of 138.401 days, which Nr. and Mrs. Curie discovered, along with radium, in pitchblende. The quantitative analysis of $^{210}Po$ is usually effected by determinating the intensity of α-ray emitted thereby, and its separation from the other elements can be effected by various processes, i.e., (1) deposition, (2) electrolytic deposition, (3) volatilization, (4) ion-exchange resin method and (5) solvent-extraction. Particularly, the process, in which, $^{210}Po$ is electrolytically deposited on a metallic plate and evaporated in vacuum, is considered to be the most reliable.

Japanese Unexamined Patent Publication (Kokai) No. 55-48645 discloses a process for analysis of α-ray emitting-nuclear species contained in a waste liquid etc. discharged from an atomic power facility to the surrounding environment. This process comprises the following steps: An electrolytic deposition cell made of a resinous material, e.g., tetrafluoroethylene resin is equipped with a bottom plate which serves as a negative electrode plate for electrolytic deposition. A mixed liquid composed of a sample solution and an electrolytic solution is charged into the electrolytic deposition cell, and a positive electrode is dipped into this mixed liquid. And an electrical voltage is applied between the electrodes, while controlling the temperature of the mixed liquid by inserting a lower portion of the electrolytic deposition cell into a temperature-controlled medium. The α-ray emitting nuclear species contained in the sample solution is deposited on the negative electrode plate, and analyzed by applying the deposited electrode plate to an apparatus for measuring α-ray, e.g., a pulse height analyzer for α-ray measurement. It is also possible to effect such an analysis by adding a known amount of other α-ray emitting nuclear species, in order to improve the analytical accuracy or to effect correction of the measurement. However, according to the description, the undesirable effects of the other radioactive elements, e.g., $^{210}Po$ etc. contained in phosphoric acid is not recognized, but also the analysis of such other elements is not discussed.

A number of technologies relating to the process for detecting radioactive elements, i.e., a process for recovering actinid series elements, including uranium from the waste of wet process of phosphoric acid, a process for regenerating phosphoric acid from its waste etc., have been disclosed. For example, U.S. Pat. No. 4,336,451 discloses preparation of a leaching acidic solution (nitric acid or hydrochloric acid etc.) in which radioactive elements of the uranium series and the thorium series are dissolved, and depositing or transferring these elements by means of non-electrolytic plating or electrolytic plating on a metallic substrate and, then, detecting the radioactive disintegration. However, this patent does not refer to the analysis of polonium in phosphoric acid. U.S. Pat. No. 3,983,219 discloses in the description of the prior art that it is possible to deposit $^{210}$Po on a platinum negative electrode from a 4 to 8N nitric acid solution by means of an electrolytic process.

Furthermore, U.S. Pat. No. 4,450,142, No. 4,162,230, No. 4,200,620 and No. 5,316,748 disclose processes for fabrication of highly purified phosphoric acid, and U.S. Pat. No. 4,749,455 and No. 4,615,776 disclose processes for regeneration of phosphoric acid waste.

SUMMARY OF THE INVENTION

As can be seen from the description set forth above, it is necessary to quantitatively separate impurities from matrix phosphoric acid in order to effect quantitative analysis of a radioactive impurity at a level of ultramicroquantity and to prepare samples for measuring the impurity preferably in the form of a thin film. It is also necessary to provide a process for removing radioactive impurities contained in phosphoric acid by means of an analytical process, and to control the process.

In the process for fabrication of a semiconductor device, it is necessary to use phosphoric acid having a low condentration of contained radioactive impurities, e.g., $^{210}$Po in order to decrease the member of soft errors generated by the radioactive impurities contained in the phosphoric acid, and also to fabricate a semiconductor device while eliminating deposition of radioactive impurities on the substrate of the device.

Therefore, the primary object of the present invention resides in providing a process for the preparation of an analytical sample adapted for use in quantitative analysis of radioactive impurities contained in phosphoric acid, which was not subjected to an appropriate control of the radioactive impurities contained therein in the prior art.

The second object of the present invention resides in providing a process for analysis of a radioactive impurity contained in phosphoric acid at a level of ultramicroquantity with a high accuracy.

The third object of the present invention resides in providing a process for preparation of highly purified phosphoric acid, capable of being advantageously applied to fabrication of semiconductor devices etc., by purifying impurity-containing phosphoric acid.

The fourth object of the present invention resides in providing a process for the fabrication of semiconductor devices, in which the substrate of the device is processed, thereby eliminating the problem of soft errors caused by the fabricating process.

The above objects and the other objects will be easily understood after referring to the following description.

According to the present invention, the primary object set forth above can be accomplished by a process for preparation of an analytical sample adapted for use in quantitative analysis of a radioactive impurity contained in phosphoric acid, characterized in that said impurity to be analyzed is solely deposited from said phosphoric acid and separated therefrom.

The second object of the present invention is accomplished by a process for quantitative analysis of a radioactive impurity contained in phosphoric acid, characterized in that said impurity to be analyzed is solely deposited from said phosphoric acid and separated therefrom, and that the resulting separated material is subjected to said analysis.

The third object of the present invention is accomplished by a process for preparation of highly purified phosphoric acid, characterized in that, in the case where highly purified phosphoric acid is prepared by means of purification of impurity-containing phosphoric acid, said impurity is solely deposited from said phosphoric acid to be purified and separated therefrom.

The fourth object of the present invention is accomplished by a process for fabrication of a semiconductor device by processing a substrate to be processed, characterized in that at least in one processing step comprised in said process for fabrication, phosphoric acid, the impurity content of which is at a level not more than $10^{-3}$ Bq/ml as defined by the concentration of a contained radioactive element selected from the group consisting of Pb, Bi and Po is used as a processing solution.

DESCRIPTION OF THE PREFERRED EMBODIMENTS

Figure 1:
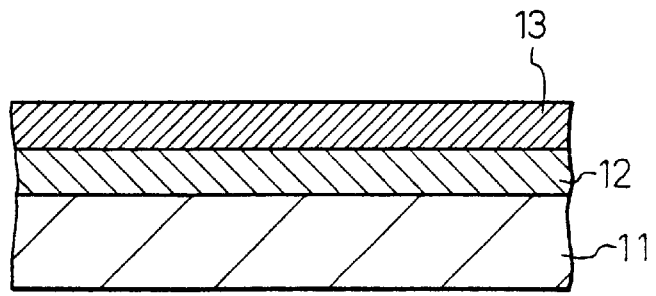
FIGS. 1A–1D are a cross-sectional view illustrating, in sequence, the steps of forming a silicon oxide layer of the LOCOS structure in accordance with the process of the present invention.
Figure 1:
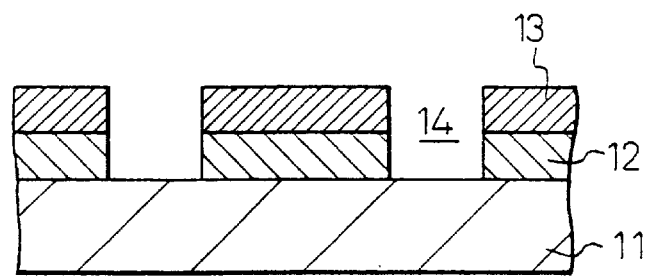
Figure 1:
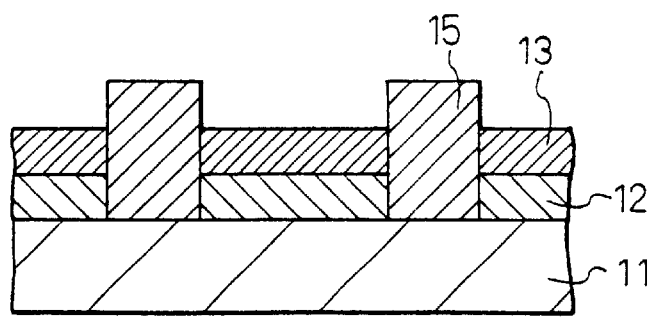
Figure 1:
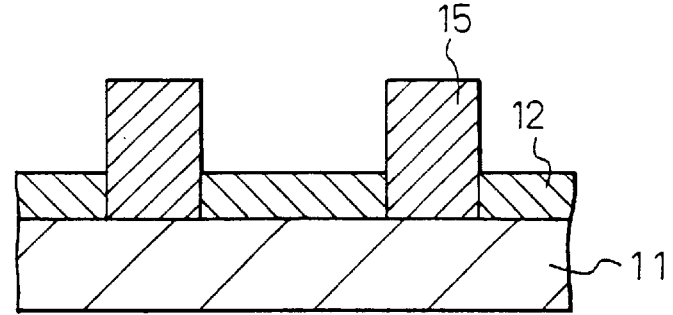

The preferred embodiment of the present invention will be detailed in the following description. Prior to the description, the purity of phosphoric acid adapted for use in the fabrication of a semiconductor device, e.g., a semiconductor memory etc. will be explained. In comparison with this, the purity of hydrochloric acid, nitric acid, hydrofluoric acid and ammonia water will be explained. Phosphoric acid is usually used as an etching agent in the form of a stock solution which has a concentration of 85% by weight.

The impurities of phosphoric acid are usually controlled by the reagent-makers as illustrated in the following table, in which the controlled level of impurities is shown in ppm.

| Impurity | Chloride | Sulfate | Nitride | Ba | Ca | Cu | Fe |
|---|---|---|---|---|---|---|---|
| Controlled Level (ppm) | 0.1 | 20 | 0.1 | 0.1 | 0.1 | 0.1 | 0.1 |

| Impurity | K | Li | Na | Ni | Sr | Mn | As |
|---|---|---|---|---|---|---|---|
| Controlled Level (ppm) | 1 | 0.1 | 0.2 | 0.1 | 0.1 | 0.1 | 0.1 |

For the purpose of comparison, the content of impurities of other aqueous etching reagents, i.e., 20% hydrochloric acid, 68% nitric acid, 38% hydrofluoric acid, and 20% ammonia water, were analyzed. The following table, in which the content of impurities is shown in ppb, illustrates the results of analysis.

| | Content (ppb) in Aqueous Solution of | | | |
|---|---|---|---|---|
| Impurity | HCl | HNO$_3$ | HF | NH$_3$ |
| Al | 0.01 | 0.02 | 0.03 | 0.02 |
| Sb | <0.02 | <0.02 | <0.05 | <0.01 |
| As | | <0.02 | | <0.001 |
| Be | <0.002 | <0.002 | <0.005 | <0.005 |
| Bi | <0.01 | <0.01 | <0.02 | <0.01 |
| Cd | <0.005 | <0.001 | <0.003 | <0.001 |
| Ca | <0.03 | 0.04 | 0.005 | 0.03 |
| Cr | <0.005 | <0.01 | <0.005 | <0.01 |
| Co | <0.005 | <0.02 | <0.05 | <0.01 |
| Cu | 0.013 | <0.01 | 0.02 | 0.03 |
| Au | <0.002 | <0.002 | <0.005 | <0.005 |
| Fe | 0.045 | 0.02 | 0.02 | 0.03 |
| Pb | <0.005 | <0.01 | <0.01 | <0.01 |
| Li | <0.01 | <0.01 | <0.002 | <0.005 |
| Mg | 0.025 | 0.04 | 0.01 | <0.005 |
| Mn | <0.01 | <0.005 | <0.01 | <0.005 |
| Ni | <0.02 | <0.01 | <0.03 | <0.03 |
| K | <0.01 | <0.005 | <0.005 | <0.005 |
| Ag | <0.001 | <0.001 | <0.002 | <0.001 |
| Na | <0.01 | 0.03 | 0.02 | 0.04 |
| Sr | <0.02 | <0.02 | <0.05 | <0.01 |
| Sn | <0.01 | <0.02 | <0.05 | <0.01 |
| Zn | <0.005 | 0.03 | 0.017 | 0.04 |
| Th* | <0.001 | <0.001 | <0.001 | <0.001 |
| U* | <0.001 | <0.001 | <0.001 | <0.001 |

The impurities Th* and U* were measured by means of ICP (Inductively Coupled Plasma) and MS (Mass Spectrometer), and the other impurities were measured by means of a flameless atomic-absorption spectrometer.

As tan be seen from the first table, the sum total of controlled level of impurities contained in phosphoric acid is 21.31 ppm. Contrary to this, the sum total of the impurities actually contained in hydrochloric acid, nitric acid, hydrofluoric acid and ammonia water are <0.275 ppb, <0.358 ppb, <0.421 ppb and <0.325 ppb, respectively. Although the controlled level of the impurities contained in phosphoric acid is in the order of ppm, the actual level of the impurities contained in hydrochloric acid, nitric acid, hydrochloric acid and ammonia water are in the order of ppb. Therefore, the purity level of phosphoric acid is lower than that of the other conventional etching reagents.

It is also known that the controlled level of impurities contained in sulfuric acid is in the order of ppb similarly to the conventional acids. It is reported that the sum total of the impurities contained in sulfuric acid is 0.902 ng/g=0.902 ppb (Donald Potter et al., "Ultra Trace Analysis of Semiconductor Grade Reagents by ICP-MS", Analytical Science, Vol. 7, Supplement 1991, pp 467 to 470). In other words, it is clear that the impurities contained in phosphoric acid are difficult to analyze and that it is not easy to highly purify phosphoric acid, even in comparison with sulfuric acid. Therefore, the test standard of phosphoric acid as an etching reagent is not severe in comparison with the other conventional etching reagents, i.e., hydrochloric acid, nitric acid, hydrofluoric acid, sulfuric acid, ammonia water, etc. According to the inventor's understanding, such a difficulty in the analysis and purification of phosphoric acid derives from its physicochemical properties, i.e., non-volatility and high viscosity, in addition to its characteristic process of fabrication. (85% by weight of phosphoric acid exhibits a boiling point 158° C., and a kinematic viscosity 28 centistokes at 20° C.).

Surprisingly, the present invention overcomes the difficulties found in the analysis of impurities contained in phosphoric acid and also in the purification thereof.

One aspect of the present invention resides in a process for the preparation of an analytical sample for quantitatively analyzing the radioactive impurity contained in phosphoric acid, and this process is characterized in that the impurity to be analyzed is solely deposited from phosphoric acid and separated therefrom. It is advisable that the analytical sample is made in the form of a tabular thin film, considering its handling convenience and its suitability to the analytical devices, but it is also possible to change its form in case of necessity.

The preparation of such an analytical sample can be realized in various embodiments. A preferable embodiment comprises the following steps;. after heating phosphoric acid, a semiconductor base formed of silicon (Si), gallium-arsenide (GaAs) etc. is dipped into heated phosphoric acid, thereby depositing the impurity to be analyzed. The desirable temperature for heating phosphoric acid is generally about 120° C. to 170° C., more preferably about 140 to 160° C. In the case of necessity, it is possible to replace the semiconductor base with silicon or a silicon-containing compound, e.g., silicon carbide (SiC) etc., on which said impurity is adsorbed. Silicon or silicon carbide can be used in its various forms, e.g., grains, powder or pellets. If necessary, it is possible to heat phosphoric acid, in which the semiconductor base has been previously dipped. Another advantageous embodiment comprises the following steps; after changing the phosphoric acid to exhibit weak acidity, the impurity to be analyzed is deposited on an electrode by means of electrolytic deposition or electroplating in the weak acidified phosphoric acid. It is meant throughout the specification by the term "weak acidity" that the acidity of phosphoric acid is changed or controlled by adding an alkali to a level adapted for use in deposition. Thus, the range of the appropriate acidity may be at an arbitrary level of not more than pH=7, preferably pH about 2 to about 5. The electrolytic deposition or electroplating may be effected according to a conventional method.

In the process for preparation of an analytical sample according to the present invention, the impurity contained in phosphoric acid to be analyzed is particularly a radioactive element selected from the group consisting of $^{210}$Po, $^{210}$Pb and $^{210}$Bi. However, the process according to the present invention may be advantageously applied to other processes relating to radioactive impurities other than $^{210}$Po, $^{210}$Pb or $^{210}$Bi, i.e., Ac, Th, U etc., including a process for preparation of an analytical sample, a process for analysis of an impurity, a process for preparation of highly purified phosphoric acid, and a process for preparation of a semiconductor device, as described in detail later.

One of the other aspects of the present invention resides in a process for quantitative analysis of an impurity contained in phosphoric acid. This process is characterized in that the impurity to be analyzed is solely deposited from the impurity-containing phosphoric acid and separated therefrom, and that the separated impurity is subjected to analysis. The step of depositing solely the impurity to be analyzed from the impurity-containing phosphoric acid may be effected similarly to the deposition or adsorption of the impurity, as described in the preparation of analytical sample set forth above.

A preferred embodiment of the process for analysis according to the present invention may comprise the following steps; after heating the impurity-containing phosphoric acid, a semiconductor base, e.g. silicon (Si), gallium arsenide (GaAs) etc. is dipped into the heated phosphoric acid, thereby depositing the impurity to be analyzed on the semiconductor base, and measuring the α-rays, β-rays or γ-rays emitted by the deposited impurity.

Another preferred embodiment of the process for analysis according to the present invention may comprise the following steps; after changing the impurity-containing phosphoric acid to exhibit weak acidity, the impurity to be analyzed is deposited on an electrode by means of electrolytic deposition of the weak acidified phosphoric acid, and, then, α-rays, β-rays or γ-rays emitted by the deposited impurity are measured.

In this process for analysis, the impurity to be analyzed is preferably a radioactive element selected from the group of Pb, Bi and Po, particularly $^{210}$Po, $^{210}$Pb or $^{210}$Bi. For example, in the case where the radioactive element to be analyzed as the impurity is $^{210}$Po, an isotope of $^{210}$Po is added as a tracer to be used for the quantitative analysis of $^{210}$Po, and that in the case where said radioactive element to be analyzed as an impurity is $^{210}$Pb, an isotope of $^{210}$Pb is added as a tracer to be used for quantitative analysis of $^{210}$Pb, and that in the case where said radioactive element to be analyzed as an impurity is $^{210}$Bi, an isotope of $^{210}$Bi is added as a tracer to be used for quantitative analysis of $^{210}$Bi. In the process according to the present invention, the impurity may be analyzed preferably by analyzing a daughter nuclear species or a granddaughter nuclear species as the impurity to be analyzed.

Another aspect of the present invention resides in a process for the preparation of a highly purified phosphoric acid by purifying impurity-containing phosphoric acid is characterized by solely depositing the impurity from phosphoric acid to be purified, and separating the impurity therefrom.

The process for preparation of highly purified phosphoric acid may comprise various embodiments. The process according to the present invention, as a preferred embodiment, may be characterized in that, after heating the phosphoric acid to be purified, a semiconductor base is dipped into a hot phosphoric acid, thereby depositing the impurity on the semiconductor base, which is, then, removed from the hot phosphoric acid. As another embodiment of this process, in place of the semiconductor base, silicon or a silicon-containing compound may be dipped into phosphoric acid, thereby adsorbing the impurity on silicon or a silicon-containing compound which was already referred to. Alternatively, as previously mentioned, heating of the phosphoric acid may be carried out after addition of the semiconductor base, silicon or silicon-containing compound to the phosphoric acid.

Another embodiment of the present invention may be a process for the preparation of a highly purified phosphoric acid characterized in that, after changing the phosphoric acid to be purified to exhibit weak acidity, the impurity is deposited by means of electrolytic deposition from the weak acidified phosphoric acid on an electrode, which is, then, removed from the weak acidified phosphoric acid.

A yet another aspect of the present invention resides in a process for fabrication of a semiconductor device characterized in that, at least in one processing step comprised in said process for fabrication, phosphoric acid, the impurity content of which is at a level not more than $10^{-3}$ Bq/ml as defined by the concentration of a contained radioactive element selected from the group consisting of Pb, Bi and Po, is used as a processing solution. In the process for fabrication of a semiconductor device according to the present invention, except for the processing step in which phosphoric acid is used as a processing solution, any convenient step known in the art may be applied, and may be arbitrarily combined. Phosphoric acid may be advantageously used as an etching solution for selectively removing an arbitrary thin film formed on a substrate to be processed.

It is preferable that the content of impurity in phosphoric acid is as small as possible. Therefore, it is advantageous that the content of impurity is at a level not more than $10^{-4}$ Bq/ml as defined by the concentration of a contained radioactive element selected from the group consisting of Pb, Bi and Po.

Relating to phosphoric acid adapted for use as a processing solution in the process for fabrication of a semiconductor device according to the present invention, the impurity to be removed from the phosphoric acid is preferably $^{210}$Po, $^{210}$Pb or $^{210}$Bi. Phosphoric acid to be used as the processing solution may be chosen from those prepared by the following processes:

After heating the phosphoric acid provided for use as a processing solution, a semiconductor base is dipped into the hot phosphoric acid, thereby depositing the impurity on the semiconductor base, which is, then, removed from the hot phosphoric acid.

After changing the phosphoric acid provided for use as a processing solution to exhibit weak acidity, the impurity is deposited by means of electrolytic deposition of the weak acidified phosphoric acid on an electrode, which is then removed from the weak acidified phosphoric acid.

Silicon or a silicon-containing compound is added to phosphoric acid provided for use as a processing solution, thereby adsorbing the impurity on silicon or a silicon-containing compound which is, then, removed from the phosphoric acid. The process for preparation of phosphoric acid was already referred to above.

In the process for fabrication of a semiconductor device, the process, in which the phosphoric acid as set forth above is applied, may be effected in the presence of a protective film formed in a phosphoric acid-unproceased area on the substrate to be processed, i.e., an area which is not intended for use. The protective film may be either previously formed on said substrate to be processed, or newly formed prior to the processing with phosphoric acid. Such a protective film is preferably a thin film formed of nitride ($Si_3N_4$) or oxide ($SiO_2$)

In the process for fabrication of a semiconductor device according to the present invention, it is possible to apply the processing, in which phosphoric acid is used as the processing solution set forth above, in various steps of its fabrication. As a preferable example, phosphoric acid is arbitrarily applied to wet etching of a silicon nitride ($Si_3N_4$) film to be used as a mask for selectively forming a $SiO_2$ film of a LOCOS structure, a gate material, a passivation film etc. It is also possible to arbitrarily use conventional wet etching which is commonly used in the field of this technology, e.g., dip etching, spray etching, jet etching, steam etching, vacuum etching etc.

Although the etching process by means of phosphoric acid according to the present invention is not limited to the examples as illustrated referring to the attached drawings, it is possible, for example, to apply phosphoric acid to the etching process of a silicon nitride ($Si_3N_4$) film which is used as a mask for forming a silicon oxide film of a LOCOS structure, as sequentially shown in FIG. 1.

Referring to FIG. 1(A), a silicon oxide ($SiO_2$) film 12 and a silicon nitride ($Si_3N_4$) film 13 are sequentially formed on a silicon substrate 11 by means of conventional lithography.

As shown in FIG. 1(B), thus formed composite film of a silicon oxide film 12 and a silicon nitride film 13 is selectively removed by a conventional lithography solely from the desired area 14 of the silicon substrate 11.

Consequently, as shown in FIG. 1(C), another silicon oxide (SiO$_2$) film 15 is grown and formed in the area 14 of the silicon substrate 11, which area was formed in the selectively removing step set forth above. This silicon oxide film 15 may be formed by means of oxidation of conventional LOCOS method, while the patterned silicon nitride film 13 serves as a mask for oxidation. After forming the LOCOS oxide film, the silicon nitride film 13, which served as a mask in the previous step, is etched by means of the highly purified phosphoric acid according to the present invention, thereby resulting a hi silicon oxide film 15 having a sectional structure as shown in FIG. 1(D).

As set forth above, the present invention may be realized by various methods, e.g., separation or deposition of a radioactive impurity from phosphoric acid. The separation or deposition of the impurity, which is one of the processes according to the present invention, comprises the steps of; changing a sample of phosphoric acid to exhibit weak acidity and depositing the impurity on a negative electrode by means of electrolytic deposition or electroplating. The deposition of the radioactive impurity and the succeeding quantitative analysis thereof are advantageously effected as follows.

A. Addition of a Tracer

A tracer is added to the analytical sample of an aqueous solution of phosphoric acid. For example, in the case where the impurity to be deposited on the electrode is $^{210}$Po, in order to quantitatively analyze said $^{210}$Po, an isotope of said $^{210}$Po is added as a tracer for the quantitative analysis of $^{210}$Po.

B. Adjustment of pH

After adding a pH indicator, an appropriate amount of alkali is added, thereby changing the sample solution to exhibit weak acidity.

C. Deposition of the Impurity

The sample solution is charged into an electrolytic deposition cell and the impurity is deposited on the electrode (negative electrode plate) to form a thin film of the impurity.

D. Quantitative Analysis of the Impurity

The radioactivity emitted by the impurity and the added tracer is obtained by measuring the radioactivity of the electrode. The amount of the impurity is quantitatively determined by using the radioactivity of the added tracer as a standard.

By applying the process set forth above, it is possible to separate the impurity from the matrix phosphoric acid, and to prepare a sample for measuring its radioactivity in the form of a thin film, thereby realizing quantitative analysis of the impurity contained in phosphoric acid to the region of a ultramicroquantity.

EXAMPLES

Referring to the following several examples, the present invention will be explained in detail. However, it should be understood that the present invention is not limited to the examples set forth below.

Example 1

Separation and Quantitative Analysis of $^{210}$Po

As sample solutions, 18 samples of commercially available aqueous solutions of 85% by weight of phosphoric acid adapted for use in wet etching, which were products of three phosphoric acid makers A, B and C, were provided. As a tracer, 1 mL of hydrochloric acid-acidified $^{210}$Po-containing standard solution was added to 5 mL of each sample solution. The tracer solution was a product of Oakridge National Laboratory Co. and contained $^{209}$Po having a half life period of 103 years. Then, after adding cresol red as a pH-indicator, an appropriate amount of sodium hydroxide solution was added, thereby adjusting pH of the sample solution to about 2.

Figure 2:
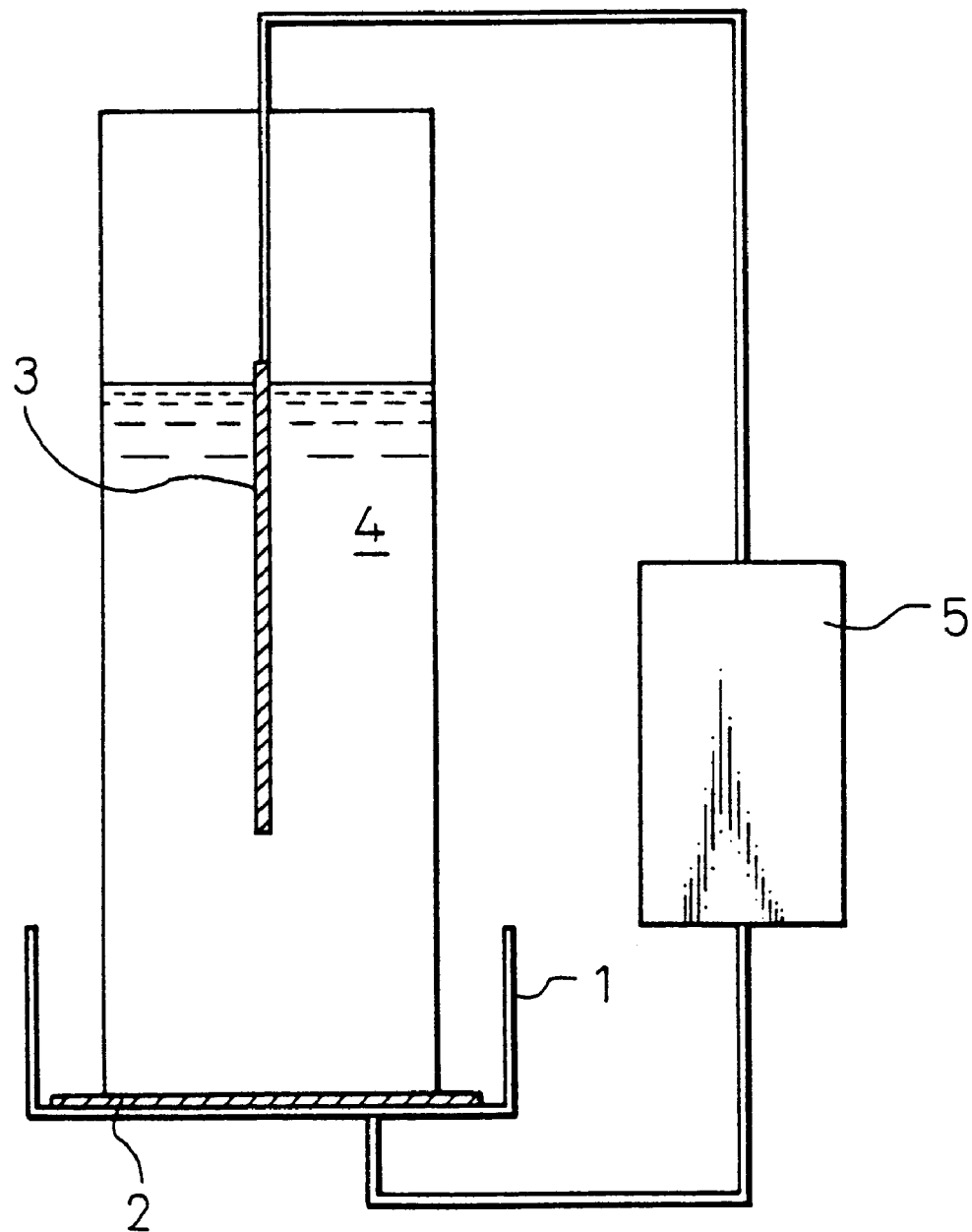
FIG. 2 is a simplified cross-sectional view showing the structure of an electrolytic deposition cell used in the practice of the present invention.

Next, the pH-adjusted sample solution was charged into an electrolytic deposition cell as diagrammatically shown in FIG. 2, which comprises a cell body 1 made of teflon™ (polytetrafluoroethylen, DuPont), a negative electrode 2 of stainless steel and a positive electrode 3 of platinum, as well as electrolyte 4 contained in the cell body 1. The electrodes 2, 3 were connected with an electric source 5. The volume of the cell was 20 mL, and the distance between the electrodes was about 1 cm. After effecting electrolytic deposition under the following conditions, polonium (Po) contained in the sample solution was deposited on the surface of the stainless steel electrode plate 2.

Constant Current Mode:
  Current Density 0.16 A/cm$^2$.
  Voltage=5 to 10V
Temperature: room temperature
Deposition Time: 3 hours The stainless steel electrode plate 2, on which polonium was deposited, was taken out of the deposition cell 1 and dried. Referring to polonium deposited in the form of a thin film on the surface of the electrode plate, α-ray emitted by $^{209}$Po (4.877 MeV) and $^{210}$Po (5.305 Mev) were respectively measured by means of a commercially available tracer-measuring apparatus, i.e., an α-ray measuring system (NAIG Co.) connected with a low background type α-ray detector having a sensitive area of 450 mm$^2$ (Seiko EG & G Co.) Based on the results of this α-ray measurement, $^{210}$Po was quantitatively analyzed by means of the counted number and the recovery ration of $^{210}$Po. The obtained results were shown in the following Table 1.

TABLE 1

Fluctuation or Distribution of $^{210}$Po concentration among the makers, grades and lots of phosphoric acid

| Maker | Grade | Lot No. | Conc. of $^{210}$Po (× 10$^{-3}$ Bg/mL) |
|---|---|---|---|
| A | I | 1 | 1.16 ± 0.06 |
| A | I | 2 | <0.01 |
| A | II | 3 | 0.74 ± 0.09 |
| A | II | 4 | 0.02 ± 0.005 |
| A | III | 5 | 0.33 ± 0.03 |
| A | III | 6 | 0.01 ± 0.005 |
| B | IV | 7 | 0.92 ± 0.09 |
| B | IV | 8 | <0.01 |
| B | IV | 9 | <0.01 |
| C | V | 1 | 0.16 ± 0.02 |
| C | V | 2 | 1.14 ± 0.09 |

Judging from the results of measurement, it was clarified that the amount of polonium, contained in the sample solutions, was quantitatively analyzed with a high accuracy and that 80% or more of the contained polonium was recovered by deposition on the surface of the stainless steel electrode plate. In other words, it was highly purified phosphoric acid solutions, which contain substantially no polonium as a radioactive impurity, were successfully prepared from commercially available phosphoric acid solutions. In addition, the existence of nuclear species other than the two types of nuclear species $^{210}$Po and $^{210}$Po, which might deposit on the stainless steel electrode plate similarly to polonium and thus disturb its measurement, was not recognized. Furthermore, it was clarified that the concentration of $^{210}$Po fluctuates much more between the lots, than between the makers and the grades of phosphoric acid.

Example 2

Separation and Quantitative Analysis of $^{210}$Po Aqueous solutions of 85% by weight of phosphoric acid adapted for use in wet etching which were produced by various makers were provided as sample solutions. As a tracer, 1 mL of a hydrochloric acid-acidified $^{209}$Po containing standard solution having a known concentration ($1.0 \times 10^{-2}$ Bq/mL) was added to 5 mL of each sample solution. The tracer solution was, similarly to Example 1, a product of Oakridge National Laboratory Co. and contained $^{209}$Po having a half life period of 103 years. Then, after adding methyl red as a pH-indicator, an appropriate amount of an aqueous solution of sodium hydroxide was added, to produce weak acidity (pH =about 2).

Figure 3:
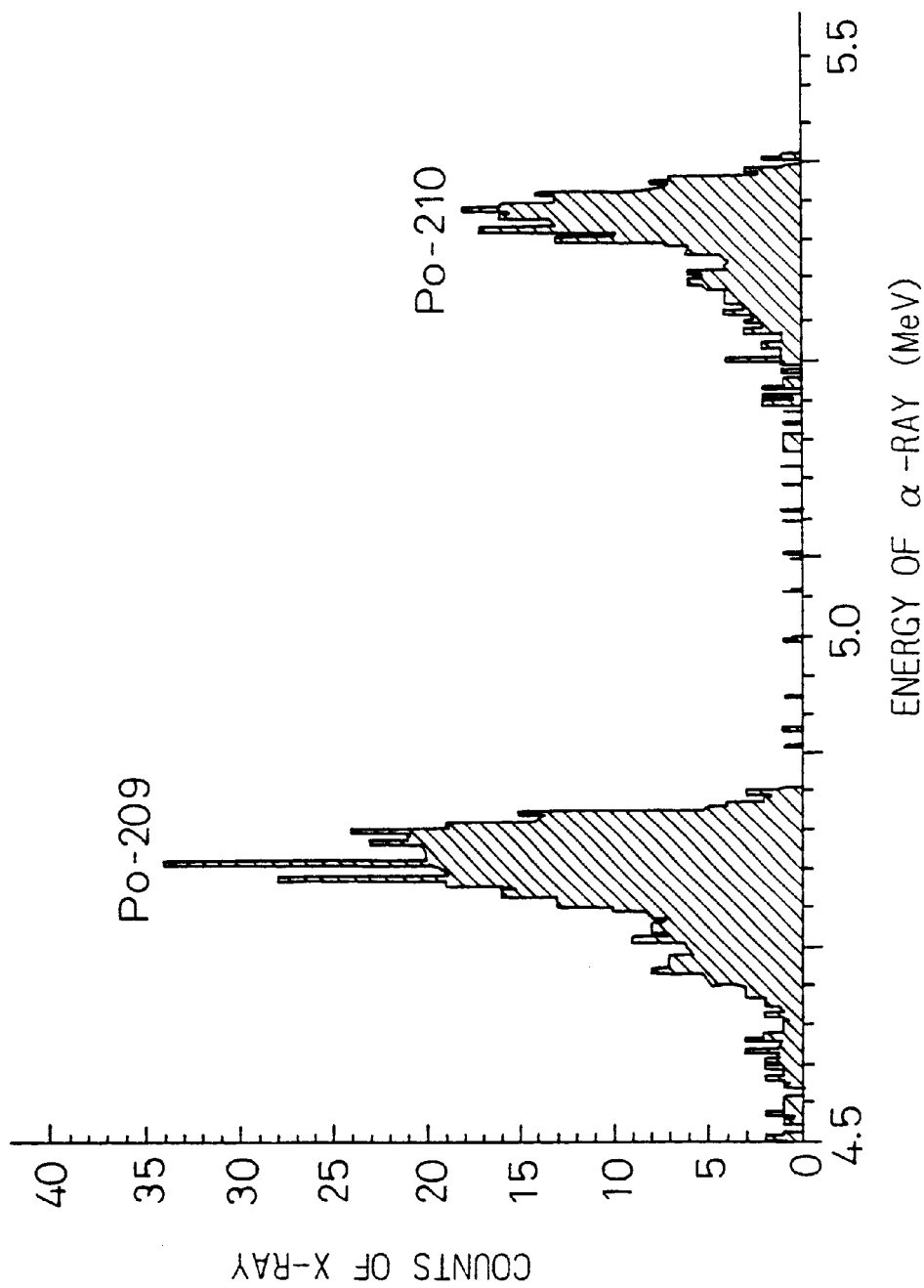
FIG. 3 is an α-ray spectrogram of $^{209}$Po and $^{210}$Po plotted according to an α-ray spectrometry.

Then, the pH-adjusted sample solution was charged into the same deposition cell as used in Example 1 (c.f. FIG. 2). Electrolytic deposition was performed under the same conditions as described in Example 1 and polonium (Po) contained in the sample solution was deposited on the surface of the stainless steel electrode plate. After application of the electric current for a predetermined time, in order to prevent dissolution of the deposited polonium in the sample solution from the surface of the electrode plate, an aqueous ammonia was dropwise added to said sample solution to make it a basic solution. After the deposition was completed, the stainless steel electrode plate, on which polonium deposited, was taken out and dried. The peaks of $^{210}$Po and $^{210}$Po were measured by means of α-ray spectrometry using the electrode plate as a sample for measuring the radioactivity. An Example of the measured results was shown in FIG. 3.

Consequentially, the quantity of $^{210}$Po was quantitatively analyzed according to the following equation:

$$A = BC/D$$

wherein A is the quantity of $^{210}$Po in the sample solution, B is the added quantity of $^{209}$Po, C is the count number of $^{210}$Po, and D is the count number of $^{210}$Po. Referring to the results of quantitative analysis of $^{210}$Po in each sample solution, it was clarified that $^{210}$Po was capable of being analyzed to the level of $10^{-5}$ Bq/mL with high reliability.

Example 3

Separation and Quantitative Analysis of $^{210}$Po

Aqueous solutions of 85% by weight of phosphoric acid, adapted for use in wet etching, which were produced by various makers were provided as sample solutions. 100 mL of each sample solution was charged into a 300 mL quartz beaker.

As a tracer, 1 mL of a hydrochloric acid-acidified $^{209}$-containing standard solution having a known concentration ($1.0 \times 10^{-2}$ Bq/mL) was added to each sample solution. The tracer solution was a product of oakridge National Laboratory Co. and contained $^{209}$Po having a half life period of 103 years. Then, after sufficient stirring, the sample solution was left standing over night. Next day, the sample solution in the quartz beaker was placed in a thermostat and heated up to about 150° C. A silicon wafer, the surface of which was previously cleaned with hydrofluoric acid (HF), was dipped into the heated sample solution and heating was continued for 120 minutes.

After the heating, the silicon wafer was taken out of the sample solution and dried. Then, utilizing the wafer as a sample for measuring radioactivity, polonium (Po) deposited on the surface of the wafer was quantitatively measured by means of α-ray spectrometry, similarly to Example 2. It was clarified that the quantitative analysis of $^{210}$Po was effected with a high accuracy to a level of $10^{-5}$ Bq/mL, with high reliability, similarly to Example 2.

Example 4

Separation and Quantitative Analysis of $^{210}$Pb

Aqueous solutions of 85% by weight of phosphoric acid, adapted for use in wet etching and produced by various makers, were provided as sample solutions. As a tracer, 1 mL of a hydrochloric acid-acidified standard solution containing $^{212}$Pb (thorium series), having a known concentration ($1 \times 10^{-2}$ Bq/mL) was added to 5 mL of each sample solution. The half life period of $^{212}$Pb contained in the tracer solution was 10.6 hours. After adding the tracer solution, the sample solution was to stand over night. Then, methyl red was added as a pH-indicator and an appropriate amount of an aqueous solution of sodium hydroxide was dropped so that the sample solution exhibited weak acidity (pH=about 2).

Consequently, the pH-adjusted sample solution was charged into the same electrolytic deposition cell as used in Example 1. Electrolytic deposition was effected under the same conditions as described in Example 1. The Pb contained in the sample solution was deposited on the surface of a stainless steel electrode plate.

After the electrolytic deposition, the stainless steel electrode plate was taken out of the cell and dried. Next, referring to the Pb deposited in the form of a thin film on the surface of the electrode plate, the intensities of γ-rays emitted by $^{212}$Pb (239 KeV) and $^{210}$Pb (47 KeV) were measured, respectively, by means of a commercially available tracer measuring apparatus and the γ-ray measuring apparatus produced by ORTEC Co. Then, based on the results of this measurement of γ-ray, $^{210}$Pb was quantitatively analyzed from the count numbers and the added quantities of $^{212}$Pb and $^{210}$Pb, respectively. Judging from the results of quantitative analysis of $^{210}$Pb in each sample solution, it was clarified that $^{210}$Pb could be quantitatively analyzed with high accuracy and high reliability.

Example 5

Separation and Quantitative Analysis of $^{210}$Bi

Aqueous solutions of 85% by weight of phosphoric acid, adapted for use in wet etching and produced by various makers, were provided as sample solutions. 1 mL of tracer $^{207}$Bi (half life period=8.04 years) exhibiting $1 \times 10^{-2}$ Bq/mL was added to 10 mL of each sample solution.

Next, Bi was extracted into the organic phase by adding a solution of dithizone in carbon tetrachloride to the sample solution in which the tracer was previously added. After separating the organic phase, a solution of 2,5-diphenyloxazole in xylene was mixed with the organic phase. $^{210}$Bi contained in the obtained mixture was measured by means of a liquid-scintillatim counter. In order to measure $^{207}$Bi contained in the solution, y-rays at 0.5697 MeV were measured by means of a germanium detector. Then, $^{210}$Bi was quantitatively analyzed based on the result of the γ-ray measurement, and the count number and the added quantity of $^{207}$Bi and of $^{210}$Bi. Judging from the results of quantitative analysis of $^{210}$Bi contained in each sample solution, it was clarified that $^{210}$Bi was capable of being quantitatively analyzed with high accuracy and high reliability.

Example 6

Preparation of Highly Purified Phosphoric Acid

After heating 100 mL of a commercially available aqueous solution of 85% by weight of phosphoric acid, to about 150° C., 5 g of granular silicon (purity=99.999999%, produced by Wako Junyaku Kogyo Co.) was added to the solution and kept at about 150° C. for 2 hours. The granular silicon was separated from the phosphoric acid solution, and the content of radioactive elements ($^{210}$Po etc.) contained in the granular silicon was measured by means of α-ray spectrometry. As a result, it was clarified that the content of radioactive elements in the granular silicon notably increased compared with the content measured prior to dipping into phosphoric acid. In other words, it was clarified that phosphoric acid, from which granular silicon was removed, contained only an ultramicroquantity of radioactive elements.

According to the inventors' understanding, it is generally possible to satisfactorily separate the impurities at a temperature of about 110° C. to about 200° C., at which temperature wet etching is effected on a silicon nitride film adapted for use as a mask formed on a silicon oxide film by LOCOS method in the processes for fabrication of a semiconductor device.

Example 7

Fabrication of a Semiconductor Device

Two types of commercially available aqueous solutions of 85% by weight of phosphoric acid adapted for use in wet etching were analyzed according to the process set forth in Example 1. It was confirmed that the concentration of radioactive material ($^{210}$Po) found in these solutions were $10^{-3}$ Bq/mL and $10^{-4}$ Bq/mL respectively. Next, the effect of the radioactive elements on the soft errors generated in semiconductor devices was estimated when these solutions were used for fabrication of semiconductor devices. The estimation was carried out by means the method described in Satoh et al., "CMOS-SRAM Soft-Error Simulation System", Annu. Proc. Reliab. Phys., 3rd, pp 339 to 343 (1994). The conditions of simulation were 256-kbit CMOS-SRAM, and the driving voltage=4.0V.

After a silicon wafer was dipped into the phosphoric acid solution and, thus, subjected to wet etching, the concentration of $^{210}$Po contained on the wafer was measured. When the concentration of $^{210}$Po contained in the phosphoric acid solution was $10^{-3}$ Bq/mL, the concentration of $^{210}$Po contained on the surface of the wafer was $3\times10^{-4}$ Bq/cm$^2$. And, when the concentration of $^{210}$Po contained in the phosphoric acid solution was $10^{-4}$ Bq/mL, the concentration of $^{210}$Po contained on the surface of the wafer was $3\times10^{-5}$ Bq/cm$^2$. The count number of soft errors were estimated by comparing the measured concentration set forth above with the simulated concentration of Satoh et al., (c.f. FIG. 13, on page 343.): in the case where the concentration of $^{210}$Po in the phosphoric acid was $10^{-3}$ Bq/mL and the concentrating of $^{210}$Po on the surface of wafer was $3\times10^{-4}$ Bq/cm$^2$, the soft error rate (SER) corresponded to $5\times10^2$ fit; and in the case where the concentration of $^{210}$Po in the phosphoric acid was $10^{-4}$ Bq/mL and the concentration of $^{210}$Po on the surface of wafer was $3\times10^{-5}$ Bq/cm$^2$, SER corresponded to $5\times10^1$ fit.

SER of $5\times10^2$ fit was a permissible level of soft error and SER of $5\times10^1$ fit was a sufficiently small rate of soft errors.

Example 8

Fabrication of a Semiconductor Device

The fabrication was carried out in the same manner as described in Example 7, except that the commercially available aqueous solution of 85% by weight of phosphoric acid, ($^{210}$Po concentration=$10^{-3}$ Bq/mL) for use in wet etching was used after it was highly purified according to the method of Example 6 with the proviso that heating was done at about 150° C. for 5 hours. The concentration of $^{210}$Po in the highly purified phosphoric acid solution was $10^{-4}$ Bq/mL. After subjecting a silicon wafer to wet etching by dipping the wafer into this phosphoric acid solution, it was recognized that the $^{210}$Po concentration on the surface of the silicon wafer was $3\times10^{-5}$ Bq/cm$^2$. Therefore, the rate of soft errors (SER) on the surface of this wafer was estimated as $5\times10^1$ fit, which was a sufficiently small rate.

Example 9

Fabrication of a Semiconductor Device

The fabrication was carried out in the same manner as described in Example 8, except that, before dipping a silicon wafer into a highly purified phosphoric acid solution ($^{210}$Po concentration=$10^{-4}$ Bq/mL), a 500 nm thick silicon nitride film was deposited on its back surface, in order to avoid the undesirable influence caused by the back surface. Wet etching was effected similarly to Example 8, and it was recognized that the $^{210}$Po concentration on the surface of the wafer was $2.8\times10^{-4}$ Bq/cm$^2$, contrary to $3.0\times10^{-4}$ Bq/cm$^2$ for a wafer having no backing. This is because that the backing could eliminate undesirable adsorbtion of $^{210}$Po on the back surface and, thus, migration of $^{210}$Po from the back surface to a front surface of the wafer, which might happen without the backing. In other words, it is very useful for reducing the generation of soft errors on a silicon nitride film that was previously formed on the back surface of a silicon wafer, which was referred to as "a phosphoric acid-unprocessed area" as set forth above.

Satisfactory effects were obtained also in the case where a silicon oxide film was formed on the back surface of a silicon wafer in place of a silicon nitride film.

As detailed above, according to the present invention, it is possible not only to easily prepare an analytical sample for quantitative analysis of the impurity containing phosphoric acid with a high sensitivity, but also to realize the quantitative analysis itself with a high sensitivity, and advantageously control the impurity contained in phosphoric acid. In addition, according to the present invention, as a result of effective separation of the impurity from the phosphoric acid, it is possible to prepare highly purified phosphoric acid which contains no impurities. Furthermore, by applying such a highly purified phosphoric acid as a processing solution, it is possible to avoid generation of soft errors, i.e., errors in the memory of a semiconductor due to the undesirable influence of the impurity. Thus, it is possible to fabricate a semiconductor device with a high reliability.

What is claimed is:

1. A process for the preparation of an analytical sample for use in quantitative analysis of a radioactive impurity in phosphoric acid, comprising:

heating said phosphoric acid to a temperature of between about 120° to 170° C.;

adding an isotope of the radioactive impurity as a tracer:

dipping, with heating, for a time period sufficient to reduce the impurity content to a level of not more than $10^{-3}$ Bw/mL as defined by the concentration of the radioactive impurity in the phosphoric acid, a semiconductor base in said phosphoric acid as heated to deposit the impurity from said phosphoric acid onto said semiconductor base; and removing said semiconductor base, having deposited thereon said impurity, from said phosphoric acid to use the same as said analytical sample.

2. A process for the preparation of an analytical sample for use in quantitative analysis of a radioactive impurity in phosphoric acid, comprising:

adding an isotope of the radioactive impurity as a tracer;

changing said phosphoric acid to exhibit weak activity;

conducting electrolytic deposition in said phosphoric acid for a time period sufficient to reduce the impurity content to a level of not more than $10^{-3}$ Bw/mL as defined by the concentration of the radioactive impurity in the phosphoric acid to deposit said impurity on an electrode immersed in said phosphoric acid; and removing said electrode, having deposited thereon said impurity, from said phosphoric acid to use the same as said analytical sample.

3. A process for the preparation of an analytical sample according to claim 1 or 2 in which the impurity to be analyzed is a radioactive element selected from the group consisting of Pb, Bi and Po.

4. A process for quantitatively analyzing a radioactive impurity in phosphoric acid, comprising:

heating said phosphoric acid to a temperature of between about 120° to 170° C.;

adding an isotope of the radioactive impurity as a tracer;

dipping, with heating, for a time period sufficient to reduce the impurity content to a level of not more than $10^{-3}$ Bw/mL as defined by the concentration of the radioactive impurity in the phosphoric acid, a semiconductor base in said phosphoric acid as heated to deposit said impurity from said phosphoric acid onto said semiconductor base;

removing said semiconductor base, having deposited thereon said impurity, from said phosphoric acid; and analyzing said impurity deposited on said semiconductor base as an analytical sample by measurement of the intensity of α-ray, βray or γray emitted by said deposited impurity.

5. A process for quantitatively analyzing a radioactive impurity in phosphoric acid, comprising:

adding an isotope of the radioactive impurity as a tracer;

conducting electrolytic deposition in said phosphoric acid, for a time period sufficient to reduce the impurity content to a level of not more than $10^{-3}$ Bw/m as defined by the concentration of the radioactive impurity in the phosphoric acid, to deposit said impurity on an electrode immersed in said phosphoric acid;

removing said electrode, having deposited thereon said impurity, from said phosphoric acid; and analyzing said impurity deposited on said electrode as an analytical sample by measurement of the intensity of α-ray, β-ray or γ-ray emitted by said deposited impurity.

6. A process according to claim 4 or 5, in which said impurity to be analyzed is a radioactive element selected from the group consisting of Pb, Bi and Po.

7. A process according to claim 6, in which, in the case where said radioactive element to be analyzed as an impurity is $^{210}$Po, an isotope of $^{210}$Po is added as a tracer to be used for the quantitative analysis of $^{210}$Po, and that in the case where said radioactive element to be analyzed as an impurity is $^{210}$Pb, an isotope of $^{210}$Pb is added as a tracer to be used for quantitative analysis of $^{210}$Pb, and that in the case where said radioactive element to be analyzed as an impurity is $^{210}$Bi, an isotope of $^{210}$Bi is added as a tracer to be used for quantitative analysis of $^{210}$Bi.

8. A process according to claim 6, in which the analysis of said impurity is effected by analyzing a daughter nuclear species or a granddaughter nuclear species of said radioactive element as said impurity to be analyzed.

* * * * *